Figure 1:
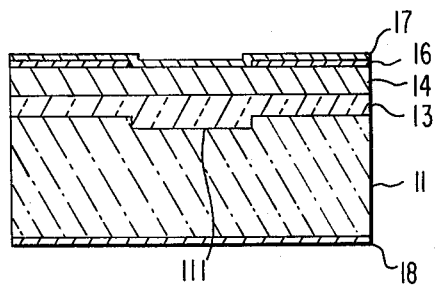

United States Patent [19]

Sakuma et al.

[11] 4,434,491
[45] Feb. 28, 1984

[54] SEMICONDUCTOR LASER

[75] Inventors: Isamu Sakuma; Katsuhiko Nishida; Hideo Kawano; Masayasu Ueno; Yoshishige Matsumoto; Shohei Matsumoto; Takao Furuse, all of Tokyo, Japan

[73] Assignee: Nippon Electric Co., Ltd., Tokyo, Japan

[21] Appl. No.: 248,157

[22] Filed: Mar. 30, 1981

[51] Int. Cl.³ .............................................. H01S 3/19
[52] U.S. Cl. ...................................... 372/48; 357/17; 372/45
[58] Field of Search ................ 372/48, 45, 46; 357/17

[56] References Cited

U.S. PATENT DOCUMENTS

| 4,105,955 | 8/1978 | Hayashi et al. | 372/45 |
| 4,280,106 | 7/1981 | Scifres et al. | 372/48 |
| 4,321,556 | 3/1982 | Sakuma | 372/48 |
| 4,326,176 | 4/1982 | Aiki et al. | 372/48 |
| 4,329,658 | 5/1982 | Doi et al. | 372/48 |

FOREIGN PATENT DOCUMENTS 55-125692  9/1980  Japan ..................................... 372/48

Primary Examiner—James W. Davie
Attorney, Agent, or Firm—Sughrue, Mion, Zinn, Macpeak and Seas

[57] ABSTRACT

A semiconductor laser of the rib guide type having the thickness of an active layer within a stripe-shaped region thicker than that of the outside, and thus the stripe-shaped region is made to have a waveguide action and, thereby, fundamental mode laser may be achieved.

8 Claims, 7 Drawing Figures

SEMICONDUCTOR LASER

The present invention relates to a semiconductor laser and more particularly to a heterojunction semiconductor laser having a structure for effecting fundamental mode lasing.

In order to bring a semiconductor laser into continuous wave lasing at room temperature, it is necessary to employ such structure that the best thermal path for removing heat from the active portion can be provided and that the optical energy and the injection current can be confined in a specific region, whereby optical and wasteful carrier recombination are simultaneously minimized. To meet this requirement, the so-called contact stripe-geometry semiconductor laser has been proposed, in which an electrode is formed in a stripe shape, so that the width of the current flowing into the active layer is limited and the optical energy is confined in the active layer.

For instance, in the case where only the current distribution is regulated as is the case with the electrode stripe type semiconductor laser, the laser light is guided in the direction of the stripe mainly due to the gain distribution. However, this waveguide action due to the gain distribution is unstable; also higher transverse mode lasing as well as multi-axial-mode lasing would be easily induced; and further this would often distort the current-light output characteristics.

Therefore, attempts have been made to rectify these shortcomings by establishing the waveguide action within a semiconductor laser as its structural feature. The so-called rib guide stripe type semiconductor laser can be understood to be one of such attempts. In this structure, as will be fully described below, it is intended that, by making the thickness of an active layer within a stripe-shaped region thicker than that of the outside, the stripe-shaped region is made to have a waveguide action and, thereby, fundamental mode lasing may be achieved.

As the prior art preceding the present invention, this rib guide stripe type semiconductor laser should be cited. In the following, at first with respect to the structure and function of this type of semiconductor laser, a brief description will be made with reference to the drawings on what problems should be resolved.

An outline of the rib guide stripe type semiconductor laser in the prior art is shown in cross-section in FIG. 1. With reference to this figure, on a (100) face n-type InP substrate 11, for example, is formed a stripe-shaped groove 111 that is in parallel to the <011> direction. On this InP substrate 11, a p-type $In_{0.76}Ga_{0.24}As_{0.55}P_{0.45}$ active layer 13 and a p-type InP layer 14 are successively formed by employing the liquid phase epitaxial process. An $SiO_2$ film 16 is deposited on the p-type InP layer 14, a window in the $SiO_2$ film 16 is formed at the portion thereof corresponding to the stripe-shaped current region so that current may flow uniformly in the active layer region right above the stripe-shaped groove 111, and then electrodes 17 and 18 are mounted, and thereby a rib guide stripe type semiconductor is completed. The active layer 13, which serves as a lasing region of this semiconductor laser, is thicker in the groove region and slightly thinner on the outside of the groove region 111. In addition, the crystal layers sandwiching the active layer 13 are the InP layers 11 and 14 whose band gaps are chosen wider than that of the active layer 13 so that their refractive indices are chosen smaller than that of the active layer 13. Since the thickness of the active layer is varied along the widthwise direction, the light within the active layer is liable to be affected more intensely by the InP crystal of the substrate at the portion having a small thickness than at the portion having a large thickness. This means that the refractive index of the active layer at the thin portion is effectively reduced as compared to the refractive index at its thick portion. In other words, even in the case where the semiconductor structure provides only an optical waveguide path, a stripe-shaped waveguide path structure having a fixed direction and an appropriate width would be provided in the active layer. For instance, making consideration on the rib guide stripe type semiconductor laser only, the transverse mode control function would not be dependent upon the gain distribution, as is the case with the electrode stripe type; as a result, stable fundamental mode lasing can be simply obtained over a wide range of injection current levels, and thus the shortcomings of the electrode stripe type semiconductor lasers in the prior art are greatly improved. In this respect, this rib structure can be said to be an epoch-making proposal.

However, this rib guide stripe type semiconductor laser had the shortcoming that the manufacture of the semiconductor laser became difficult in view of its structure and dimensions. For instance, the practical dimensions, for establishing in the active layer region the equivalent refractive index difference for realizing an optical waveguide function required for fundamental transverse mode lasing, are optimum at a groove depth of 0.04 μm and a groove width of about 8 μm if the thickness of the active layer is 0.2 μm, and, if the depth of the groove becomes larger than twice the above-referred value, then the equivalent refractive index difference is easily increased and higher mode lasing is liable to occur. In order to control the magnitude of this equivalent refractive index difference to achieve the optimum value for fundamental transverse mode lasing, one selects the depth of the groove at an appropriate depth and also varies the thickness of the active layer. If the depth of the groove is constant, when the layer thickness becomes thick, the equivalent refractive index difference would be reduced, and on the contrary when the layer thickness becomes thin, it would be increased. In view of the ease of manufacture and the controllability of the layer thickness, it is more favorable to select the active layer to be thick to a certain extent. However, a thick active layer is disadvantageous in that the lasing threshold current is enhanced. On the other hand, if the active layer is made thin, then the lasing threshold current would become low, but the equivalent refractive index difference tends to be increased, and hence, slight non-uniformity of the depth of the groove would cause the equivalent refractive index difference to vary largely. In addition, with respect to the depth of the groove, it is necessary to uniformly provide a groove of 0.04 μm or less in depth with good reproducibility.

The above-described conditions on the structure and dimensions which are necessitated in view of the performance would, naturally, greatly degrade controllability and reproducibility in manufacturing.

Furthermore, if one tries to realize a high output power, then faults would arise because higher order transverse lasing is more likely to to occur and the threshold current is enhanced.

It is an object of the present invention to provide a novel structure of a semiconductor laser, in which the aforementioned shortcomings are eliminated, control for fundamental mode lasing is simple, the lasing threshold current is small, and realization of a high output power is possible, and which is easy to manufacture and is suitable for mass-production with a high yield.

The aforementioned object of the present invention can be achieved by the semiconductor laser structure as described hereunder. The essence of the structure of the semiconductor laser according to the present invention is as follows. At first, an elongated groove is formed on a surface of an n-type semiconductor. Subsequently, an optical guide and carrier confinement layer (hereinafter abbreviated as an optical guide layer), an active layer and a photon/carrier confinement layer (hereinafter abbreviated as a carrier confinement layer) are continuously grown on the grooved surface of the semiconductor substrate through the conventional epitaxial growing process, and then the active layer is doped so that it may form a rectifying junction with the carrier confinement layer. Then the groove is completely filled by the optical guide layer. The active layer is grown on the flattened surface of the optical guide layer formed on the grooved surface of the semiconductor substrate. Electrodes are mounted on the carrier confinement layer and the semiconductor substrate, respectively, so that an injection current can be injected into the active layer region located right above the stripe-shaped groove.

Figure 2:
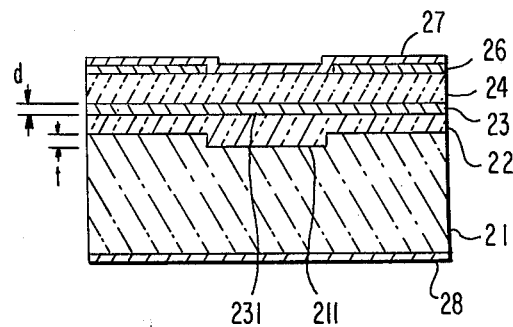
Figure 3:
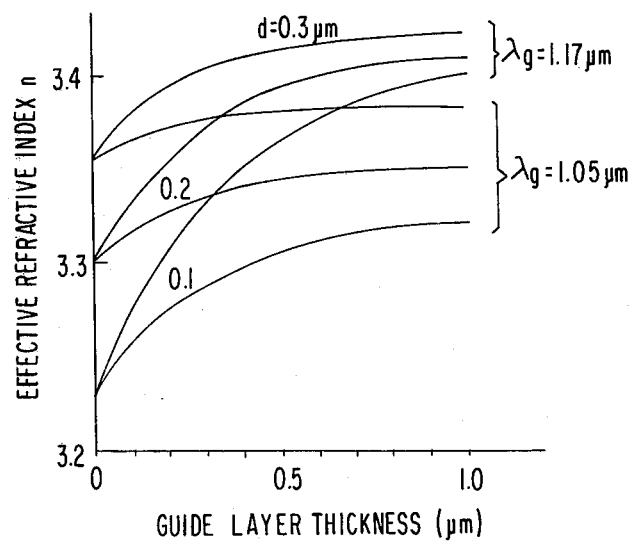

The above-mentioned and other features and objects of the present invention will become more apparent by reference to the following description of its preferred embodiments taken in conjunction with the accompanying drawings, wherein:

FIG. 1 is a transverse cross-sectional view showing an outline of a rib guide stripe type semiconductor layer in the prior art, FIG. 2 is transverse cross-section of a semiconductor laser according to a first preferred embodiment of the present invention, FIG. 3 is a graph of the effective refractive index versus the thickness of the optical guide layer at the central portion.

Figure 4:
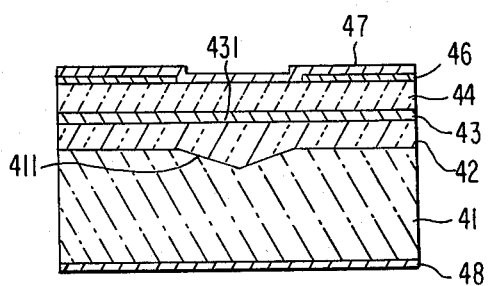
Figure 5:
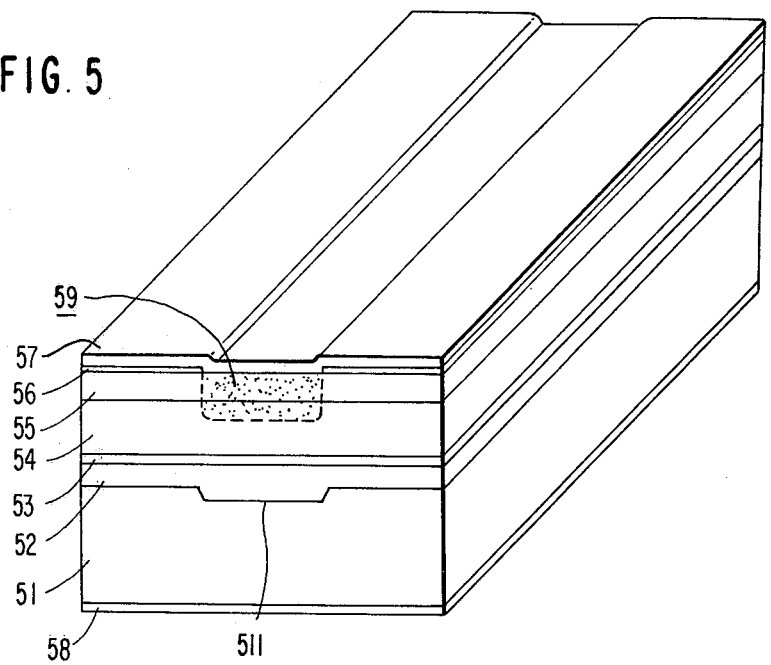
Figure 6:
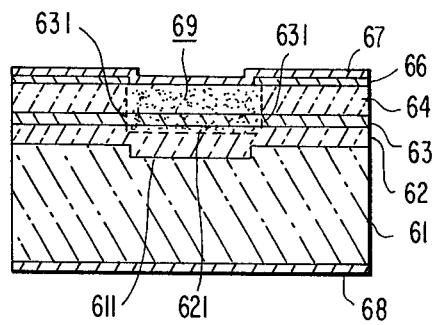
Figure 7:
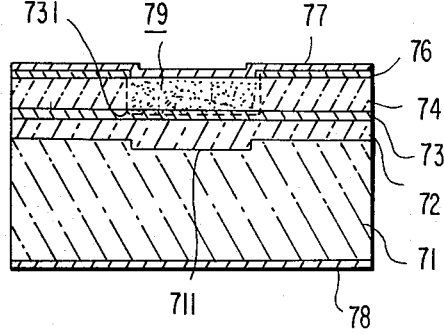

FIG. 4 is a transverse cross-sectional view of a semiconductor laser showing a second preferred embodiment of the present invention, FIG. 5 is a perspective view of a semiconductor laser showing a third preferred embodiment of the present invention, FIG. 6 is a transverse cross-sectional view of a semiconductor laser showing a fourth preferred embodiment of the present invention, and FIG. 7 is a transverse cross-sectional view of a semiconductor laser showing a fifth preferred embodiment of the present invention.

Referring to FIG. 2, an elongated groove 211 having a rectangular cross-section is formed on a semiconductor substrate 21, and three semiconductor layers are successively grown in the order of a first layer 22 serving as an optical guide layer, a second layer 23 serving as an active layer and a third layer 24 serving as a carrier confinement layer. The optical guide layer 22 and the active layer 23 are of different conductivity types, and hence a rectifying junction 231 is formed therebetween. An $SiO_2$ film 26 having an elongated window formed therein is deposited on the surface of the carrier confinement layer 24 with the window located right above the elongated groove 211. Then, electrodes 27 and 28 are deposited, respectively, so as to make contact with the semiconductor substrate 21 and with the carrier confinement layer 24 via the window to form a forward biased rectifying junction 231 between the optical guide layer 22 and the active layer 23. The active layer 23, in which, when the rectifying junction 231 is forward biased, carriers are injected and light is emitted by recombination of the carriers, is sandwiched by the optical guide layer 22 and the carrier confinement layer 24 on the opposite sides thereof which have larger band gaps and smaller refractive indices than the active layer 23, thereby achieving confinement of the carriers; on the other hand, the emitted light penetrates into the optical guide layer 22 having a slightly smaller refractive index, and the complete confinement of the photons is achieved by the semiconductor substrate 21 and the carrier confinement layer 24. In other words, the illustrated structure is a double hetero-structure in which confinement of photons and confinement of carriers are separated.

The invention will be described in greater detail hereunder with respect to the case where InP-InGa AsP are used as semiconductor layers.

A photo-resist film is deposited on a surface of an n-type InP substrate 21, and after exposure to light, an elongated window of 5 μm in width is formed in the photo-resist film, and a stripe-shaped groove 211 having a rectangular cross-section is formed on the substrate 21 by making use of the window as a mask for relative etching. Groove dimensions of 0.2 μm depth and 5 μm in are employed. Then, the remaining photo-resist film is removed from the surface of the InP substrate 21, and the following layers are continuously grown on the InP substrate 21 through the liquid phase epitaxial growing process. At first, an n-type $In_{0.9} Ga_{0.1} As_{0.23} P_{0.71}$ layer 22 is grown on the grooved InP substrate 21. This growth is continued until the groove 211 has been completely filled up and the entire upper surface of the optical guide layer 22 has become substantially flat. Subsequently, a p-type $In_{0.76} Ga_{0.24} As_{0.55} P_{0.45}$ active layer 23 and a carrier confinement layer 24 consisting of a p-type InP are grown, and the process is terminated. When an active layer 23 and guide layer 22 are represented as $In_{1-x} Ga_x As_y P_{1-y}$ and $In_{1-a} Ga_a As_b P_{1-b}$, respectively, composition ratios x, y, a and b are determined so as to satisfy the matching condition of lattice constance, i.e., $0<(x, a)<0.47$ and $0<(y, b)<1$.

Typical thicknesses of the respective layers are, in the groove region, 0.5 μm for the optical guide layer 22, 0.2 μm for the active layer 23 and 1.5 μm for the carrier confinement layer 24 respectively.

Then an $SiO_2$ film 26 is deposited on the surface of the carrier confinement layer 24 through the conventional process, and an elongated window is formed in the $SiO_2$ film 26 at the position right above the groove 211 by the known photo-etching process.

Finally, a p-type electrode 27 is deposited on the $SiO_2$ film 26 so as to make contact with the carrier confinement layer 24 through the window thereof, while an n-type electrode 28 is deposited on the back side of the InP substrate 21 so as to make contact therewith, and thereby the manufacture is completed.

In operation, the rectifying junction 231 is fowardly biased by applying a positive potential to the electrode 27 and a negative potential to the electrode 28, and thereby carriers are injected into the active layer 23. The active layer 23 is sandwiched by the optical guide layer 22 and the carrier confinement layer 24 on the opposite sides thereof, both of which have larger band gaps. More particularly, owing to the hetero-junction in which in contrast to the band gap of 0.95 eV of the $In_{0.76}Ga_{0.24}As_{0.55}P_{0.45}$ active layer 23, the band gap of the $In_{0.9}Ga_{0.1}As_{0.23}P_{0.77}$ optical guide layer 22 is 1.18 eV and the band gap of the InP carrier confinement layer 24 is 1.34 eV, the carriers injected into the active layer 23 can be confined within the active layer 23 without diffusing. The band gap difference between the active layer 23 and the carrier confinement layer 24 is 0.39 eV, whereas the band gap difference between the active layer 23 and the optical guide layer 22 is as small as 0.23 eV. Consequently, it is surmised that the diffusion of injected carriers from the active layer 23 to the optical guide layer 22 will occur in a larger amount than that to the carrier confinement layer 24. However, according to the present invention, a semiconductor substrate 21 having a still larger band gap is disposed adjacent to the optical guide layer 22. In other words, the band gap difference of 0.16 eV between the optical guide layer 22 and the carrier confinement semiconductor substrate 21 acts as a potential barrier for preventing the carriers diffused into the optical guide layer 22 from further diffusing into the carrier confining semiconductor substrate 21. Therefore, the practically occurring carrier diffusion is very small, and so, the carrier confining effect within the active layer 23 is not deteriorated at all by the provision of the optical guide layer 22.

On the other hand, light is generated by recombinations within the active layer 23, and when a gain overcomes a loss owing to a sufficient amount of injection current, laser light is emitted from the active layer 23. This laser light penetrates into the optical guide layer 22. Since the optical guide layer 22 is sufficiently transparent for the laser light generated in the active layer 23 (a lasing wavelength being about 1.30 $\mu$m), the laser light is not subjected to any loss within the optical guide layer 22. Therefore, the laser light beam propagates while expanding over the optical guide layer 22 and the active layer 23. In this connection, in contrast to the refractive index $n_3 = 3.512$ of the active layer 23, the refractive index of the optical guide layer 22 is $n_2 = 3.338$. Due to the small difference in the effective refractive indices between these respective layers, the waveguide action along the boundary surface between the active layer 23 and the optical guide layer 22 is very weak. However, since the refractive index of the semiconductor substrate 21 and the carrier confinement layer 24 (the refractive index of InP being $n_1 \approx n_4 \approx 3.2$) sandwiching the layers 22 and 23 therebetween is small as compared to that of the layers 22 and 23, a strong waveguide path can be formed. Especially, the laser light is guided by the layers 21 and 24 having smaller refractive indexes, and so, photons are confined in the region 22 and 23.

In addition, as the optical guide layer 22 has different layer thickness between the region right above the groove 211 and the region outside of the groove 211, the light propagating in parallel to the plane of the rectifying junction 231 is strongly subjected to an optical waveguide action equivalent to that of the case where the refractive index in the groove region is effectively increased as compared to the refractive index in the region outside of the groove. In other words, the illustrated structure is equivalent to provision of optical waveguide means similar to the rib guide stripe type semiconductor laser.

Now the optical waveguide means according to the present invention will be described in greater detail.

In the waveguide path consisting of the structure formed of four laminated layers of crystals having different refractive indices as is the case with the present invention, it can be theoretically calculated how much the effective refractive index difference ($\Delta n = n_A - n_B$) is between the thick ridged portion ($n_A$) and the outside portion ($n_B$) of the guide layer 22.

The method of calculation is such that a fundamental mode of electromagnetic wave propagating through the waveguide path having the four-layer structure is resolved from a wave equation on the basis of the boundary conditions at the boundaries between the respective layers to obtain a propagation constant ($\beta$), and the effective refractive index n is obtained from the relation of $n = (\beta/k)$ (k: wave number).

As a result of such calculations, as shown in FIG. 3, it has been proved that when the thickness d of the active layer is kept constant, the effective refractive index n of the guide layer is increased as the guide layer becomes thicker, and if the active layer becomes thicker, then the effective refractive index n is increased because the amount of light penetrating into the guide layer is decreased. On the other band, the closer the combinations of the guide layer and the active layers are to each other, that is, the larger the refractive index of the guide layer is, the more the light penetrating into the guide layer is increased, and the more the effective refractive index n becomes sensitive to the variation of the thickness of the guide layer. In FIG. 3, a guide layer consisting of a composition corresponding to a band gap wavelength $\lambda g = 1.17$ $\mu$m has a larger refractive index than that of another guide layer having a composition corresponding to a band gap wavelength $\lambda g = 1.05$ $\mu$m. In order to make the penetration of light into the optical guide layer effective, it is necessary that the refractive indices of the respective layers have such relation in magnitude that the refractive index $n_3$ of the active layer is the largest one and the unequality $n_3 > n_2 > n_4 \sim n_1$ is fulfilled, where $n_1$, $n_2$, $n_3$ and $n_3$ are refractive indices of the clad layer, optical guide layer, active layer and other clad layer.

The optical waveguide action according to the present invention is achieved by such refractive index distribution that the effective refractive index of the groove region is always larger than that of the outside of the groove region.

In order to stably maintain a fundamental transverse mode up to a high output power, it is necessary to establish an effective refractive index difference $\Delta n = n_A - n_B$ of the order of $10^{-3}$. If the value of the difference $\Delta n$ becomes large, generally higher transverse mode lasing would readily occur, but on the contrary if the difference $\Delta n$ becomes small, then stable optical waveguide action would be deteriorated. For a practical laser structure, therefore, it is necessary to preset the difference $\Delta n$ by taking the above-mentioned fact well into consideration. For instance, when a guide layer having a composition corresponding to a bandgap wavelength $\lambda G = 1.05$ $\mu$m is employed and an active layer thickness $d = 0.2$ $\mu$m is selected, an effective refractive index difference $\Delta n \sim 8 \times 10^{-3}$ can be realized by selecting the thickness of the ridged portion of the guide layer at 0.5 $\mu$m and that of the outside portion at 0.3 $\mu$m (the depth of the groove t = 0.2 $\mu$m).

In one practical example, an experimental value of the difference $\Delta n$ obtained by measuring a light divergent angle in the plane parallel to the pn-junction of the laser element was approximately equal to $1 \times 10^{-12}$, and the fundamental transverse mode lasing could be maintained up to a current value more than twice as high as the lasing threshold value.

For the purpose of forming a stable optical waveguide path, it is necessary that the surface of the optical guide layer is flat and an active layer having a uniform thickness is grown thereon. There is established between the depth of the groove formed on the substrate and the thickness of the grown layer a predetermined growth condition which is necessary for filling the groove and making the layer surface flat.

As a result of experiments it has been proved that the growth condition is such that, if the thickness of the layer grown in the region outside of the groove region is made large as compared to the depth t of the groove, then the groove can be completely filled and also the surface of the grown layer becomes flat.

Therefore, according to the present invention, taking into consideration the reproducibility and the yield in manufacture, the depth t of the groove is limited to less than the thickness of the optical guide layer, and the optical waveguide path under this limited condition is sufficient for obtaining the necessary refractive index.

For instance, in the case of filling a groove of 10 $\mu$m in width and about 1.5 $\mu$m in depth, if the thickness of the grown layer outside of the groove is 1.5 $\mu$m or more, then the surface of the grown layer becomes flat, whereas if the thickness is less than 1.5 $\mu$m, the groove cannot be filled completely and unevenness arises on the surface of the grown layer.

Taking into consideration the stability of the fundamental transverse mode, the width of the groove becomes optimum at 2~5 $\mu$m, and desirably it should not be wider than these values.

According to the above-described first preferred embodiment of the present invention employing a rectangular groove on the n-type InP substrate, formation of an optical waveguide path, which can propagate only a fundamental transverse mode within the layers 22 and 23, can be achieved by appropriately controlling the thickness of the optical guide layer 22 and the depth of the groove 211 while maintaining the thickness of the active layer 23 constant.

Now description will be made on a second preferred embodiment of the present invention as shown in FIG. 4. This second preferred embodiment is different from the above-described first preferred embodiment only in that the groove formed on the surface of the semiconductor substrate has a V-shaped cross-section rather than a rectangular cross-section.

In the following, the second preferred embodiment will be described in connection with the case where InP-In Ga As P are employed as semiconductor layers.

On a surface of an n-type InP substrate 41, a photo-resist film is deposited, and after exposure to light, an elongated V-shaped groove 411 having a width of 2 $\mu$m is formed. The V-shaped cross-section has the dimensions of 0.5 $\mu$m in depth and 2 $\mu$m in width. Then, the remaining photo-resist film is removed from the surface of the InP substrate 41, and the following layers are continuously grown on the InP substrate 41 through the liquid phase epitaxial growing process. At first, an optical guide layer 42 consisting of an n-type $In_{0.9} Ga_{0.1} As_{0.23} P_{0.77}$ is grown on the grooved InP substrate 41. This growth is continued until the V-shaped groove 411 has been completely filled up and the entire upper surface of the optical guide layer 42 has become substantially flat. Subsequently, an active layer 43 consisting of a p-type $In_{0.76} Ga_{0.24} As_{0.55} P_{0.45}$ and a carrier confinement layer 44 consisting of a p-type InP are grown, and the process is terminated.

Typical thickness of the respective layers are, in the V-shaped groove region, 0.8 $\mu$m for the $In_{0.9} Ga_{0.1} As_{0.23} P_{0.77}$ layer 42, 0.1 $\mu$m for the $In_{0.76} Ga_{0.24} As_{0.55} P_{0.45}$ active layer 43, and 1.5 $\mu$m for the InP layer, respectively.

Then an $SiO_2$ film 46, p-type electrode 47 and an n-type electrode 48 are provided in the same manner as described in the first embodiment shown in FIG. 2.

In the above-described second preferred embodiment of the present invention, the thickness of the optical guide layer 42 varies along the direction in parallel to the rectifying junction 431 so as to become thickest at the center of the region above the V-shaped groove 411. Accordingly, the refractive index in the transverse direction of the optical guide layer 42 varies in accordance with the variation of thickness and takes the maximum value at the center of the groove 411. In other words, the above-described structure is equivalent to the provision of optical waveguide means similar to the rib structure in the light emitting region.

In the above-described second preferred embodiment, the transverse mode control is achieved by means of the aforementioned optical wavelength means. Especially, the characteristic feature of the semiconductor laser according to the second preferred embodiment exists in that the refractive index distribution forming the optical waveguide path has a symmetric form having the highest value at the center of the optical waveguide path and gradually reducing towards the outside of the path, and as a result, besides the control for the fundamental transverse mode, the optical waveguide path can achieve the function of concentrating the controlled laser light to the center of the optical waveguide path. This light concentrating function can provide the advantages that the beam size of the laser light is made smaller, and further, maintenance of the fundamental transverse mode can be achieved over a wide operating current region. Another advantage of the second preferred embodiment is that a high output power can be readily realized owing to the fact that the thickness of the light emitting region at its center portion is large.

Furthermore, according to the second preferred embodiment, the transverse mode control can be achieved by controlling the thickness of the guide layer and the width of the V-shaped groove without varying the thickness of the active layer. Therefore, the thickness of the active layer can be designed so as to minimize the lasing threshold current.

It is to be noted that, while the groove formed on the semiconductor substrate surface has a V-shaped cross-section in the above described second preferred embodiment, as a matter of course, it could have a semicircular or U-shaped cross-sectional configurations, or it could have a further modification of these cross-sectional configuration.

For instance, in the example in which a U-shaped groove is employed, the refractive index distribution is such that the portion where the refractive index takes the maximum value is flat and located at the center of the groove, and the refractive index is gradually decreased towards the outside of the U-shaped groove. As a result, this structure has a characteristic advantage that a concentrated laser beam having a large beam diameter in the lateral direction can be obtained. This is advantageous because a high output power can be realized more easily.

Referring now to FIG. 5, similarly to the first embodiment shown in FIG. 2, an optical guide layer 52 of n-In Ga As P, an active layer 53 of non-doped In Ga As P and a carrier confinement layer 54 of p-InP are successively grown on an n-InP substrate 51 having a groove 511. As a third preferable embodiment of the present invention, a contact-facilitating layer or cap layer 55 of n-InP is additionally grown on the carrier confinement layer 54. The cap layer 55 has a conductivity type opposite that of the carrier confinement layer 54 in this embodiment. Then an $SiO_2$ film 26 having a stripe window is provided in the same manner as described in the first embodiment. In order to make an injection current path in the cap layer 54, cadmium (Cd) is diffused into the cap layer 55 through the window of the $SiO_2$ film 26 so as to partly change the conductivity type of the cap layer 55 and to reach at least to the carrier confinement layer 54. Electrodes 57 and 58 are provided in the same manner as described in the first embodiment. The dimensions and compositions of each layer are approximately equal to the case of the first embodiment shown in FIG. 2. The approximate thickness of the cap layer 55 is 1 $\mu$m.

Referring to FIG. 6, a fourth preferred embodiment according to the present invention indicates a similar structure to the first embodiment to the extent that an optical guide layer 62, an active layer 63 and a carrier confinement layer 64 are successively grown on an substrate 61 having a groove 61. Then an $SiO_2$ film 66 having a window is formed on the carrier confinement layer 64. The dimensions and compositions of each layer are approximately equal to the first embodiment as shown in FIG. 2. However, all layers 62, 63 and 64 as well as substrate 61 have the same conductivity such as n-type conductivity, and in that case, zinc (Zn) is diffused through the window of the $SiO_2$ film 26 so as to change a part of the n-type conductivity of the layers 62, 63 and 64 to p-type conductivity. In this embodiment, a diffusion front 621 extends to the optical guide layer 62, and thus an InP homo-junction is formed in the optical guide layer 62 and a pair of InGaAsP homo-junctions 631 is formed in the active layer 63. Since the band gap of the active layer is the smallest among three layers 62, 63 and 64, the injected current is concentrated to the homo-junctions 631. When a carrier concentration of the n-type regions of the active layer 63 is selected in the range larger than $1 \times 10^{18}$ cm$^{-3}$, the refractive index of the converted p-type region 69 in the active layer 63 can be increased by controlling a carrier concentration of the converted p-type region of the active layer in the range smaller than $5 \times 10^{18}$ cm$^{-3}$. This fourth embodiment can attain a high efficiency of injection current into the emission region, and thus a drive current is decreased.

FIG. 7 shows the case that the diffusion front is terminated in the active layer of the fourth embodiment shown in FIG. 6. Accordingly, an optical guide layer 72, an active layer 73 and a carrier confinement layer 74 are successively grown on a substrate 71 having a groove 711. The dimensions and compositions of these layers 71, 72, 73 and 74 are the same as those of layers 61, 62, 63 and 64 of the fourth embodiment. Reference numerals 76, 77 and 78 designate a $SiO_2$ film, p-type electrode and n-type electrode, respectively. Since the p-type converted region 79 is terminated in the active layer 73, carriers are injected into the region 79 from three portions of the optical guide layer 72, and a pair of homo-junctions 731 are formed in the active layer 73. According to this structure, emission is not split into two portions even if the width of the converted region 79 becomes wider than the carrier diffusion length.

In the foregoing last three embodiments, when a diffusion region is spaced apart from a pair of reflective end surfaces, n-type regions between the diffusion region and the reflective end surfaces become transparent to the emitted light and thus higher-power output can be attained, and, furthermore, the life-time of the laser device can be increased.

Furthermore, although a groove is formed on a substrate in the foregoing five embodiments, on additional semiconductor layer grown on a substrate as a buffer layer can be used to provide a groove thereon. Also, the mentioned $SiO_2$ film may be omitted if another current restriction means is used.

As described above, according to the present invention, there are provided the advantages that formation of an optical waveguide path can be achieved without varying the thickness of the active layer, and that the semiconductor laser has a low lasing threshold current and can achieve fundamental transverse mode lasing due to the fact that the laser has a structure in which a carrier confinement region and a photon confinement region are completely separated from each other. Furthermore, a high output power can be realized without enhancing the lasing threshold current. As compared to the conventional rib structure, the depth of the groove formed on the surface of the semiconductor substrate would less sensitively affect the magnitude of the effective refractive index difference required for forming the optical waveguide path, and hence, the structure of the semiconductor laser according to the present invention has the advantages of being easy to manufacture, of high reproducibility and of being easily mass-produced.

Upon forming means for injecting carriers into the active layer, if provision is made such that a current may be efficiently injected into the active layer region opposite the position of the stripe-shaped groove, then the operating current can be further reduced and thereby the differential quantum efficiency of light emission can be increased. Therefore, the stripe-shaped electrode formed by the intermediary of the $SiO_2$ film as seen in the above-described preferred embodiments has a poor injection efficiency. If a structure having a good current injection efficiency is employed such as, for example, the structure in which a layer for limiting the current to within a path passing through the groove region is provided within the semiconductor substrate, that is, the structure in which a backwardly biased junction is formed between the portion outside of the groove within the semiconductor substrate and the optical guide layer, then the effects and advantages of the present invention will be further improved.

In addition, although description has been made in the above preferred embodiments with respect to the case where a liquid phase epitaxial process is employed as the crystal growing process, the same effects and advantages can be obtained even in the case where the present invention is practiced by employing a different crystal growing process such as, for example, a molecular beam epitaxial process.

What is claimed is:

1. Semiconductor laser comprising a semiconductor crystal having a pair of principal surfaces and a pair of reflective end surfaces constituting an optical resonator, a pair of electrodes, and an insulating layer having an opening, said semiconductor crystal including a semiconductor substrate of a first electrical conductivity type and first, second and third semiconductor layers successively grown on said substrate, said substrate having a groove which contacts said first layer and which extends between said pair of reflective end surfaces in a stripe geometry, said first layer being of said first conductivity type and having a narrower band gap than that of said substrate and being formed to provide a substantially flat interface with said second layer and thereby providing a thick portion on said groove and a pair of thinner portions on both sides of said groove, said thick portion extending between said pair of reflective end surfaces along said groove, said thin portions having a thickness not less than the depth of said groove and extending between said pair of reflective end surfaces, said second layer having a narrower band gap than that of said first layer and being formed to provide a substantially flat interface with said third layer and thereby having a uniform thickness, said third layer being of a second conductivity type and having a wider band gap than those of said first and second layers, said insulating layer being provided on one of said principal surfaces on the side of said third layer with said opening aligned with said convex region of said second region, one of said pair of electrodes being provided on said one of said principal surfaces through said opening, and the other of said pair of electrodes being provided on the other of said principal surfaces.

2. A semiconductor laser as claimed in claim 1, in which said substrate and third layer are formed of InP and said first and second layers are formed of $In_{1-x} Ga_x As_y P_{1-y}$ and where $0 < x < 0.47$ and $0 < y < 1$.

3. A semiconductor laser comprising a semiconductor crystal having a pair of principal surfaces and a pair of reflective end surfaces constituting an optical resonator, and a pair of electrodes, said semiconductor crystal including a base semiconductor layer having a first electrical conductivity type and first, second and third semiconductor layers successively provided on said base layer, said base layer having a groove in contact with said first layer and extending between said pair of reflective end surfaces in a stripe geometry, said first layer having said first conductivity type and a narrower band gap than that of said baser layer and providing a thick elongated portion along said groove and thinner portions outside said groove, said thinner portions having a thickness not less than a depth of said groove, said second layer having a narrower band gap than that of said first layer, said third layer having a wider band gap than those of said first and second layers and having a second conductivity type at least in a region located above said groove, and said electrodes being provided on said principal surfaces.

4. A semiconductor laser as claimed in claim 1, 2 or 3 wherein the transverse cross-section of said groove is rectangular.

5. A semiconductor laser as claimed in claim 1, 2 or 3 wherein the transverse cross-section of said groove is V-shaped.

6. A semiconductor laser as claimed in claim 1, 2 or 3 further comprising a cap layer between said third layer and one of said electrodes, said cap layer being of said first conductivity type, and a diffusion of said second conductivity type extending through said cap layer and into said third layer in the region above said groove.

7. A semiconductor laser comprising a semiconductor crystal having a pair of principal surfaces and a pair of reflective end surfaces constituting an optical resonator, and a pair of electrodes, said semiconductor crystal including a base semiconductor layer having a first electrical conductivity type and first, second and third semiconductor layers successively provided on said base layer and all having said first electrical conductivity type, said base layer having a groove in contact with said first layer and extending between said pair of reflective end surfaces in a stripe geometry, said first layer having a narrower band gap than that of said base layer and providing a thick elongated portion along said groove and thinner portions outside said groove, said thinner portions having a thickness not less than a depth of said groove, said second layer having a narrower band gap than that of said first layer, said third layer having a wider band gap than those of said first and second layers, a diffusion of the opposite conductivity type extending through said third layer and into said second layer and positioned above, and co-extensively with, said groove, the length and width dimensions of said diffusion being substantially equal to those of said groove, and said electrodes being provided on said principal surfaces.

8. A semiconductor laser as defined in claim 7 wherein said diffusion extends into said first layer.

* * * * *

UNITED STATES PATENT AND TRADEMARK OFFICE
CERTIFICATE OF CORRECTION

PATENT NO. : 4,434,491

DATED : February 28, 1984

INVENTOR(S) : Sakuma et al

It is certified that error appears in the above-identified patent and that said Letters Patent is hereby corrected as shown below:

Column 2, line 65, after "to", delete "to".

Column 3, line 37, after "is", insert --a--.

Column 4, line 29, before "depth", insert --in--;

line 30, before "are", insert --width--.

Column 6, line 20, after "and", insert --a--;

line 23, after "other", change "band" to --hand--.

Column 8, line 57, after "cross-sectional", change "configurations," to --configuration,--;

line 59, after "tional", change "configuration" to --configurations--.

UNITED STATES PATENT AND TRADEMARK OFFICE
CERTIFICATE OF CORRECTION

PATENT NO. : 4,434,491

DATED : February 28, 1984

INVENTOR(S) : Sakuma et al

It is certified that error appears in the above-identified patent and that said Letters Patent is hereby corrected as shown below:

Column 10, line 14, before "additional", change "on" to --an--.

Column 11, line 46, after "said", change "baser" to --base--.

Signed and Sealed this

Thirtieth Day of July 1985

[SEAL]

*Attest:*

DONALD J. QUIGG

*Attesting Officer*  *Acting Commissioner of Patents and Trademarks*